(12) United States Patent
Tsai et al.

(10) Patent No.: US 12,112,669 B2
(45) Date of Patent: Oct. 8, 2024

(54) DISPLAY DEVICE AND DRIVING CIRCUIT STRUCTURE

(71) Applicant: E Ink Holdings Inc., Hsinchu (TW)

(72) Inventors: Shu-Fen Tsai, Hsinchu (TW); Chen-Yun Ma, Hsinchu (TW); Puru Howard Shieh, Hsinchu (TW); Chih-Ching Wang, Hsinchu (TW)

(73) Assignee: E Ink Holdings Inc., Hsinchu (TW)

( * ) Notice: Subject to any disclaimer, the term of this patent is extended or adjusted under 35 U.S.C. 154(b) by 0 days.

(21) Appl. No.: 18/297,003

(22) Filed: Apr. 7, 2023

(65) Prior Publication Data

US 2023/0352452 A1    Nov. 2, 2023

(30) Foreign Application Priority Data

Apr. 28, 2022 (TW) .................................. 111116159
Oct. 24, 2022 (TW) .................................. 111140171

(51) Int. Cl.
*G06F 3/044* (2006.01)
*G09G 3/00* (2006.01)
(Continued)

(52) U.S. Cl.
CPC .............. *G09G 3/035* (2020.08); *G09G 3/20* (2013.01); *H01L 24/05* (2013.01); *H01L 24/06* (2013.01);
(Continued)

(58) Field of Classification Search
None
See application file for complete search history.

(56) References Cited

U.S. PATENT DOCUMENTS 8,772,780 B2   7/2014 Huang et al.
8,873,015 B2   10/2014 Seki et al.
(Continued)

FOREIGN PATENT DOCUMENTS

CN    103917039 A    7/2014
CN    107561799 A    1/2018
(Continued)

OTHER PUBLICATIONS

The office action of the corresponding TW application No. 111116159 issued on Apr. 10, 2023.
(Continued)

*Primary Examiner* — Carl Adams
(74) *Attorney, Agent, or Firm* — CKC & Partners Co., LLC

(57) ABSTRACT

A display device includes a display region and a periphery region surrounding the display region. The display device includes an driving circuit substrate, a TFT array substrate, a front plane laminate, and multiple conductive wires. The driving circuit substrate includes multiple first conductive pads. The TFT array substrate includes multiple second conductive pads. The TFT array substrate is located on the driving circuit substrate. The TFT array substrate is located between the driving circuit substrate and the front plane laminate. The conductive wires are electrically connected with the first conductive pads and the second conductive pads, respectively. The first conductive pads and the second conductive pads are located in the periphery region.

15 Claims, 13 Drawing Sheets

(51) Int. Cl.
*G09G 3/20* (2006.01)
*H01L 23/00* (2006.01)
*H01L 25/065* (2023.01)
*H01L 27/12* (2006.01)

(52) U.S. Cl.
CPC .......... *H01L 24/48* (2013.01); *H01L 25/0657* (2013.01); *H01L 27/1218* (2013.01); *H01L 27/124* (2013.01); *G09G 2300/0426* (2013.01); *H01L 2224/05573* (2013.01); *H01L 2224/06145* (2013.01); *H01L 2224/48145* (2013.01); *H01L 2225/06506* (2013.01)

(56) References Cited

U.S. PATENT DOCUMENTS

| | | | |
|---|---|---|---|
| 9,275,574 B2 | 3/2016 | Hur et al. | |
| 9,454,025 B2 | 9/2016 | Zhong et al. | |
| 10,034,369 B2 | 7/2018 | Park et al. | |
| 10,079,069 B2 | 9/2018 | Jin | |
| 10,229,964 B2 | 3/2019 | Kim et al. | |
| 10,451,942 B2 | 10/2019 | Yu et al. | |
| 10,481,729 B2 | 11/2019 | Park | |
| 10,497,772 B2 | 12/2019 | Lhee et al. | |
| 10,831,073 B1 | 11/2020 | Wu | |
| 10,877,332 B2 | 12/2020 | Drzaic et al. | |
| 11,060,922 B2 | 7/2021 | Altenbeck et al. | |
| 11,107,416 B2 | 8/2021 | Cho et al. | |
| 11,150,706 B2 | 10/2021 | Horiuchi et al. | |
| 11,221,718 B2 | 1/2022 | Choi et al. | |
| 11,415,843 B2 | 8/2022 | Ye et al. | |
| 2003/0134460 A1* | 7/2003 | Forbes ................ H01L 27/1262 257/E21.414 | |
| 2007/0164948 A1 | 7/2007 | Kim et al. | |
| 2009/0325342 A1 | 12/2009 | Takiar et al. | |
| 2009/0325344 A1 | 12/2009 | Takiar et al. | |
| 2010/0134743 A1 | 6/2010 | Shin et al. | |
| 2011/0115765 A1 | 5/2011 | Chang | |
| 2012/0313905 A1 | 12/2012 | Kang et al. | |
| 2013/0207134 A1 | 8/2013 | Shin et al. | |
| 2015/0279918 A1 | 10/2015 | Teraguchi et al. | |
| 2016/0219723 A1 | 7/2016 | Jung et al. | |
| 2016/0291382 A1 | 10/2016 | Chai | |
| 2016/0300853 A1 | 10/2016 | Yamazaki | |
| 2017/0219895 A1 | 8/2017 | Yu et al. | |
| 2017/0309644 A1 | 10/2017 | Yeh | |
| 2018/0090091 A1* | 3/2018 | Sim ...................... G09G 3/3688 | |
| 2018/0095309 A1 | 4/2018 | Yu et al. | |
| 2018/0108677 A1 | 4/2018 | Yeh | |
| 2018/0267353 A1* | 9/2018 | Takeda .............. G02F 1/136286 | |
| 2020/0203465 A1 | 6/2020 | Kim et al. | |
| 2020/0379523 A1 | 12/2020 | Horiuchi et al. | |
| 2020/0402967 A1 | 12/2020 | Yoshida | |
| 2021/0089158 A1 | 3/2021 | Kang et al. | |
| 2021/0110782 A1 | 4/2021 | Hur et al. | |
| 2021/0132429 A1 | 5/2021 | Jang et al. | |
| 2021/0225879 A1 | 7/2021 | Asai et al. | |
| 2021/0298210 A1 | 9/2021 | Huang et al. | |
| 2023/0299091 A1 | 9/2023 | Lan et al. | |
| 2023/0306886 A1 | 9/2023 | Xiong et al. | |
| 2023/0352452 A1 | 11/2023 | Tsai et al. | |

FOREIGN PATENT DOCUMENTS

| | | |
|---|---|---|
| CN | 108389538 A | 8/2018 |
| CN | 109712558 A | 5/2019 |
| CN | 209674154 U | 11/2019 |
| CN | 111952321 A | 11/2020 |
| CN | 112652275 A | 4/2021 |
| CN | 112840475 A | 5/2021 |
| CN | 113129799 A | 7/2021 |
| CN | 116819838 A | 9/2023 |
| KR | 20110016794 A | 2/2011 |
| KR | 20200072782 A | 6/2020 |
| KR | 20230132642 A | 9/2023 |
| TW | 201339725 A | 10/2013 |
| TW | 201826477 A | 7/2018 |
| TW | M575190 U | 3/2019 |
| TW | 201928624 A | 7/2019 |
| TW | 202109480 A | 3/2021 |
| TW | 202121036 A | 6/2021 |
| TW | 202131522 A | 8/2021 |
| TW | 202137862 A | 10/2021 |
| WO | 2021184915 A1 | 9/2021 |

OTHER PUBLICATIONS

The office action of related TW application No. 111140171 issued on Sep. 28, 2023.
The office action of corresponding TW application No. 112139459 issued on Jan. 31, 2024.
The office action of related U.S. Appl. No. 18/185,360 issued on Dec. 22, 2023.
The office action of related U.S. Appl. No. 18/185,360 issued on Apr. 9, 2024.

* cited by examiner

DISPLAY DEVICE AND DRIVING CIRCUIT STRUCTURE

CROSS-REFERENCE TO RELATED APPLICATION

This application claims priority to Taiwan Application Serial Number 111116159, filed Apr. 28, 2022, and Taiwan Application Serial Number 111140171, filed Oct. 24, 2022, which are herein incorporated by reference in their entireties.

BACKGROUND

Field of Invention

The present invention relates to a display device and a driving circuit structure.

Description of Related Art

Nowadays, signal circuits (e.g., data line and selection line) in a display panel may be assembled to the same side of the panel. That is, the signal circuits are assembled to a bonding region in the periphery region. The signal circuits are connected electrically to the IC on a flexible substrate through chip on film process. The aforementioned bonding method of the IC or the layout makes the bonding region obviously protruded outwardly. As a result, the profile of the display device is limited by the protruded bonding region.

Accordingly, it is still a development direction for the industry to provide a display device that can solve the problems mentioned above.

SUMMARY

The invention provides a display device.

In some embodiments, the display device has a display region and a periphery region surrounding the display region. The display device includes an driving circuit substrate, a TFT array substrate, a front plane laminate, and multiple conductive wires. The driving circuit substrate includes multiple first conductive pads. The TFT array substrate includes multiple second conductive pads, and the TFT array substrate is located on the driving circuit substrate. The TFT array substrate is located between the driving circuit substrate and the front plane laminate. The conductive wires are electrically connected with the first conductive pads and the second conductive pads respectively. The first conductive pads and the second conductive pads are located in the periphery region.

In some embodiments, an orthogonal projection of the TFT array substrate on the driving circuit substrate is free from overlapping with the first conductive pads.

In some embodiments, an area of the driving circuit substrate is greater than an area of the TFT array substrate.

In some embodiments, the first conductive pads averagely surround the TFT array substrate.

In some embodiments, the first conductive pads are located on a surface of the driving circuit substrate facing the TFT array substrate.

In some embodiments, the second conductive pads averagely surround the front plane laminate.

In some embodiments, the driving circuit substrate, the TFT array substrate, and the front plane laminate have a circular shape.

In some embodiments, the TFT array substrate further includes multiple data lines extending along a first direction, the data lines are electrically connected with a portion of the second conductive pads, and the portion of the second conductive pads are located at opposite two sides of the display device along the first direction.

In some embodiments, the TFT array substrate further includes multiple scan lines extending along a second direction, the scan lines are electrically connected with a portion of the second conductive pads, and the portion of the second conductive pads are located at opposite two sides of the display device along the second direction.

In some embodiments, the TFT array substrate further includes multiple selection lines extending along a second direction, the selection lines are electrically connected with a portion of the second conductive pads, and the portion of the second conductive pads are located at opposite two sides of the display device along the second direction.

In some embodiments, the driving circuit substrate further includes a first pattern, and the TFT array substrate further includes a second pattern matching the first pattern.

Another aspect of the present disclosure is a display device.

In some embodiments, the display device has a display region and a periphery region surrounding the display region. The display device includes an driving circuit substrate, a TFT array substrate, a front plane laminate, and multiple conductive wires. The driving circuit substrate includes multiple first conductive pads and a driver connection region. The driver connection region is located at a side of the driving circuit substrate. The TFT array substrate includes multiple second conductive pads, and the TFT array substrate is located on the driving circuit substrate. The TFT array substrate is located between the driving circuit substrate and the front plane laminate. The conductive wires are electrically connected with the first conductive pads and the second conductive pads respectively. When viewed in a top view, the side of the driving circuit substrate is located inside of a boundary form by the driving circuit substrate and the TFT array substrate collectively.

In some embodiments, the driving circuit substrate further includes multiple first driving circuits, and opposite two sides of each one of the first driving circuits are electrically connected with one of the first conductive pads and connected with the driver connection region.

In some embodiments, the driving circuit substrate further includes multiple common voltage circuits, and opposite two sides of each one of the common voltage circuits are electrically connected with one of the first conductive pads and connected with the driver connection region.

In some embodiments, one of the first conductive pads is electrically connected with more than one of the common voltage circuits.

In some embodiments, the boundary collectively formed by the driving circuit substrate, the TFT array substrate, and the front plane laminate has a circular shape.

Another aspect of the present disclosure is a display device.

In some embodiments, the driving circuit structure includes an driving circuit substrate and a TFT array substrate. The driving circuit substrate includes a driver connection region, and the driver connection region is located at a side of the driving circuit substrate. The TFT array substrate is located on the driving circuit substrate. When viewed in a top view, the side of the driving circuit substrate is located inside a boundary form by the driving circuit substrate and the TFT array substrate collectively.

In the aforementioned embodiments, by stacking the TFT array substrate and the driving circuit substrate of the display device and distributing the first conductive pads and the second conductive pads averagely in the periphery region (which means the first bonding region and the second bonding region surround the display region), a bonding region protruded from the periphery region obviously can be avoid. Such design prevents the profile of the display device from affecting by the outwardly protruded bonding region. In addition, the trace lengths can be reduced and the possibility of crossing of the traces can be reduced by electrically connecting the signal circuits to different second conductive pads based on the extension direction of the signal circuits.

BRIEF DESCRIPTION OF THE DRAWINGS

The invention can be more fully understood by reading the following detailed description of the embodiment, with reference made to the accompanying drawings as follows.

DETAILED DESCRIPTION

Figure 1:
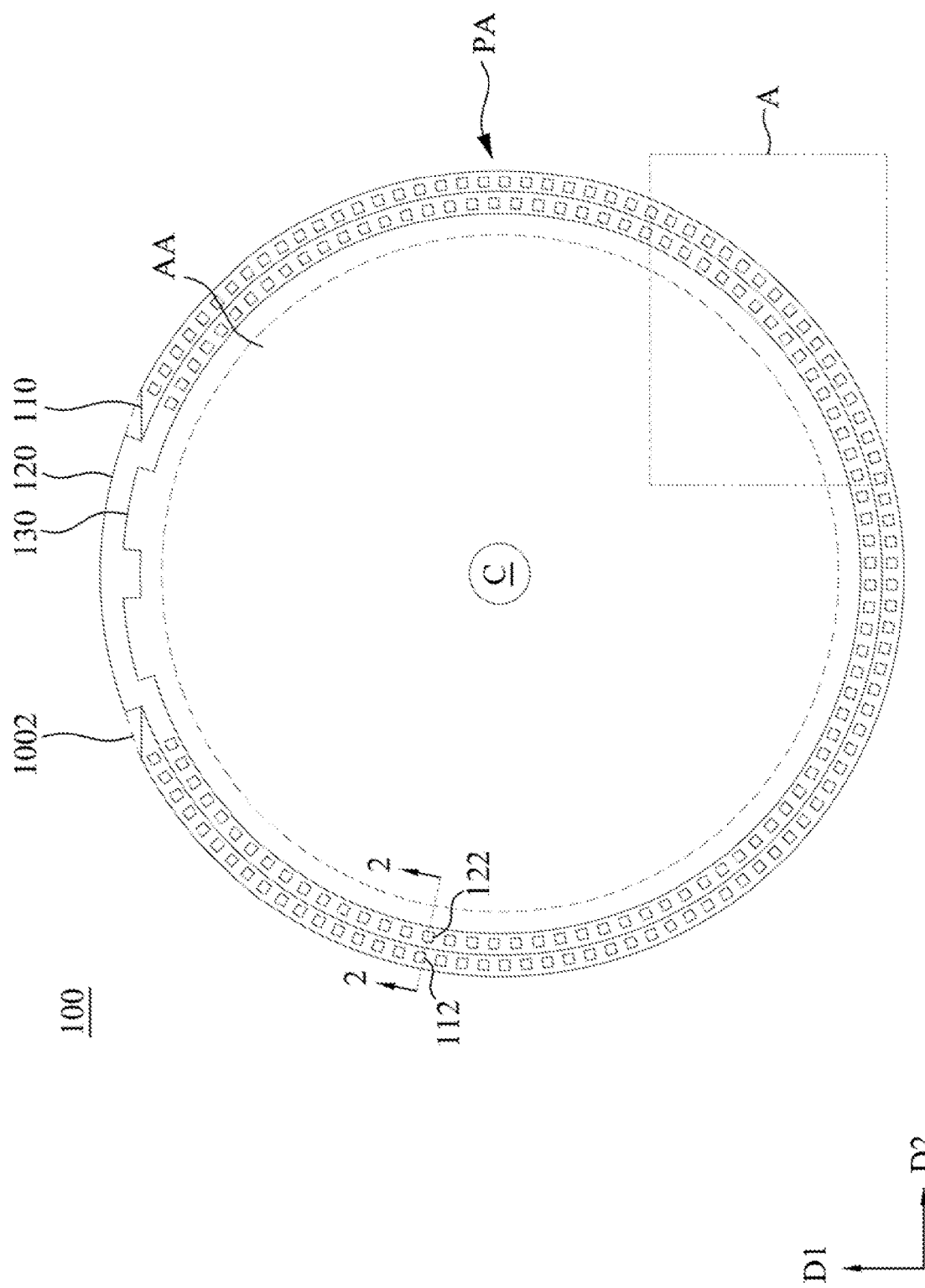
FIG. 1 is a top view of a display device according to one embodiment of the present disclosure.

Reference will now be made in detail to the present embodiments of the invention, examples of which are illustrated in the accompanying drawings. Wherever possible, the same reference numbers are used in the drawings and the description to refer to the same or like parts.

Figure 2:
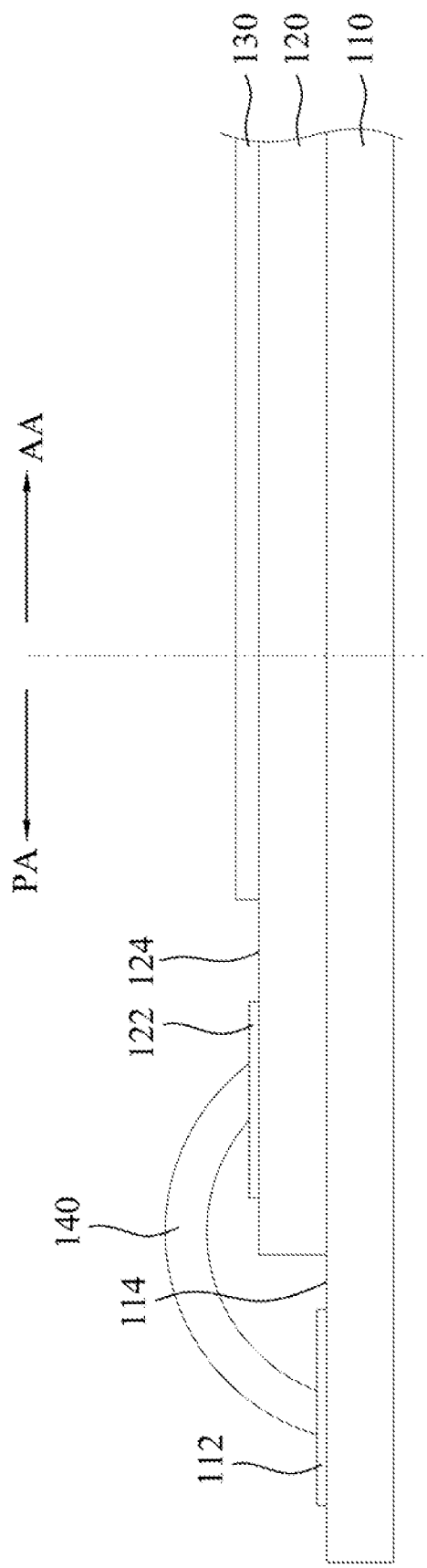
FIG. 2 is a cross-sectional view taken along the line 2-2 in FIG. 1.

FIG. 1 is a top view of a display device 100 according to one embodiment of the present disclosure. FIG. 2 is a cross-sectional view taken along the line 2-2 in FIG. 1. Reference is made to FIG. 1 and FIG. 2. The display device 100 includes a display region AA and a periphery region PA surrounding the display region AA. The display device 100 includes an driving circuit substrate 110, a TFT (Thin film transistor) array substrate 120, and a front panel laminate 130. The TFT array substrate 120 is located on the driving circuit substrate 110, and the front panel laminate 130 is located on the TFT array substrate 120. The TFT array substrate 120 is located between the driving circuit substrate 110 and the front panel laminate 130.

For example, the display device 100 is a clock. The IC drivers and systematic components such as motor and battery for the clock are integrated in the driving circuit substrate 110. The TFT array substrate 120 includes a glass substrate and gate, source/drain, insulating layers, and pixel electrode structures (not shown) formed on the glass substrate. The front panel laminate 130 includes display medium layer, transparent conductive layer or adhesive layers (not shown), but the present disclosure is not limited thereof. For example, the display medium layer can be a liquid crystal layer or an electronic ink layer.

Reference is made to FIG. 1 and FIG. 2. An overall profile of a stacked driving circuit substrate 110 and the TFT array substrate 120 substantially has a circular shape. In a bottom view shown in FIG. 1, the driving circuit substrate 110 and the TFT array substrate 120 collectively form a boundary 1002. The driving circuit substrate 110, the TFT array substrate 120, and the front panel laminate 130 all have circular shapes, but the present discloser is not limited thereto. In other embodiments, the display device 100 may have a rectangular shape. An area of the driving circuit substrate 110 is greater than an area of the TFT array substrate 120, and the area of the TFT array substrate 120 is greater than an area of the front panel laminate 130.

Figure 3:
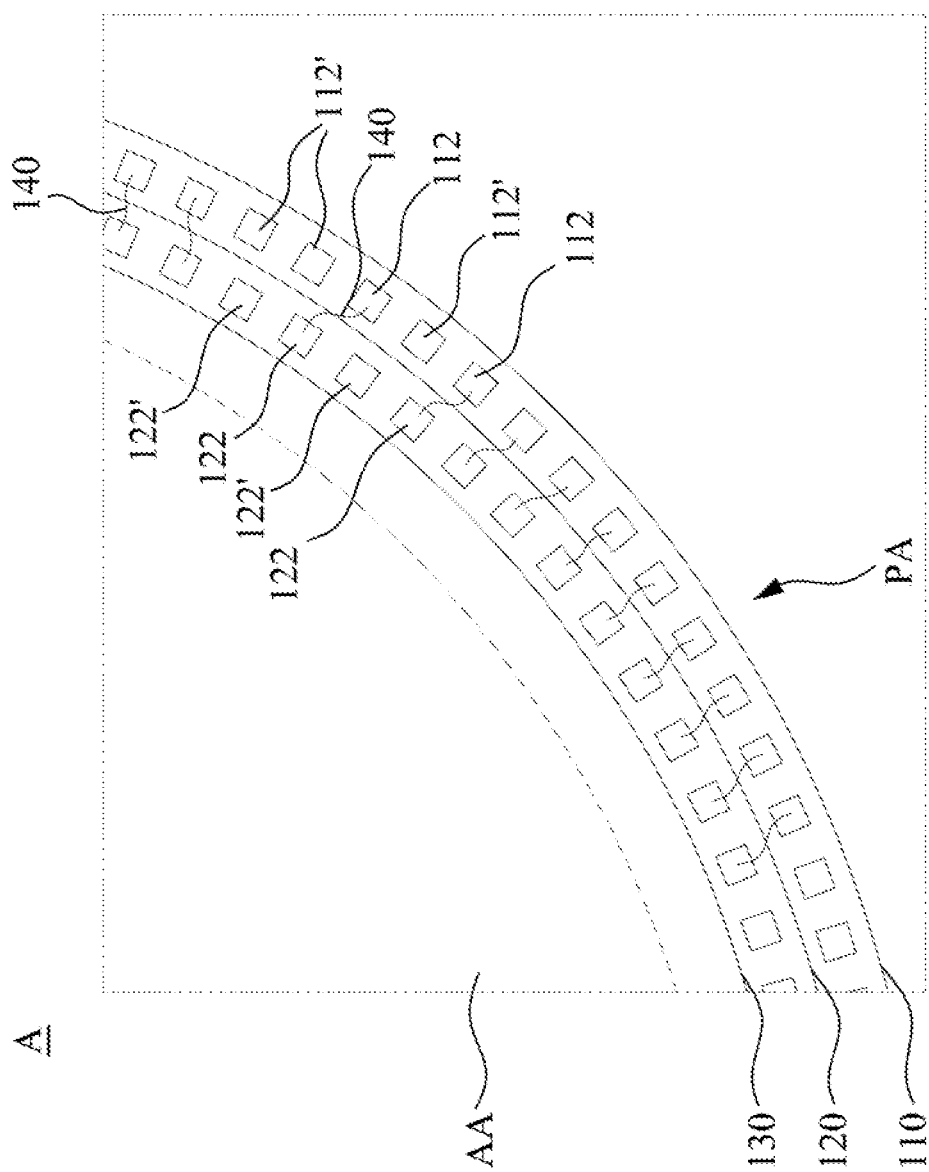
FIG. 3 is an enlarged view of a framed region in FIG. 1.

FIG. 3 is an enlarged view of a framed region A in FIG. 1. Reference is made to FIG. 2 and FIG. 3. The display device 100 further includes multiple conductive wires 140. For clarity, the conductive wires 140 are omitted in FIG. 1. The driving circuit substrate 110 includes multiple first conductive pads 112, and the TFT array substrate 120 includes multiple second conductive pads 122. The first conductive pads 112 and the second conductive pads 122 averagely distributed in the periphery region PA. In other words, the first conductive pads 112 and the second conductive pads 122 surround the display region AA. The conductive wires 140 are electrically connected with the first conductive pads 112 and the second conductive pads 122, respectively. The connection configuration of the conductive wires 140 is not limited thereto in FIG. 2. In another embodiment of the present disclosure, conductive through holes are formed at the positions on the TFT array substrate 120 corresponding to the second conductive pads 122. The conductive wires 140 are formed in the conductive through holes and are connected to the first conductive pads 112. As such, the conductive wires 140 can be electrically connected with the first conductive pads 112 and the second conductive pads 122.

Reference is made to FIG. 3. The signal circuits in the TFT array substrate 120 is connected with the second conductive pads 122, and a portion of the conductive pads 122 can have no electrical connection with the signal circuits optionally. In other words, a portion of the first conductive pads 112 are dummy first conductive pads 112', and a portion of the second conductive pads 122 are dummy second conductive pads 122'. The dummy first conductive pads 112' and the dummy second conductive pads 122' are not configured to transmit signals. With such design, the distances between the first conductive pads 112 and the dummy first conductive pads 112' are more equal, and the distances between the second conductive pads 122 and the dummy second conductive pads 122' are more equal.

Reference is made to FIG. 2 and FIG. 3. An orthogonal projection of the TFT array substrate 120 on the driving circuit substrate 110 is free from overlapping with the first conductive pads 112. In other words, the first conductive pads 112 surround the TFT array substrate 120. An orthogonal projection of the front panel laminate 130 on the TFT array substrate 120 is free from overlapping with the second conductive pads 122. That is, the second conductive pads 122 surround the front panel laminate 130. The first conductive pads 112 are located on a surface 114 of the driving circuit substrate 110 facing the TFT array substrate 120, and the second conductive pads 122 are located on a surface 124 of the TFT array substrate 120 facing the front panel laminate 130.

By stacking the TFT array substrate 120 and the driving circuit substrate 110 of the display device 100 and distributing the first conductive pads 112 and the second conductive pads 122 averagely in the periphery region PA in the present disclosure, a bonding region protruded from the periphery region PA obviously can be avoid. For example, with the embodiment in FIG. 1 as an example, such design makes the shape of the TFT array substrate 120 more like circular shape. That is, the profile of the display device 100 is not affected by the outwardly protruded bonding region.

Figure 4:
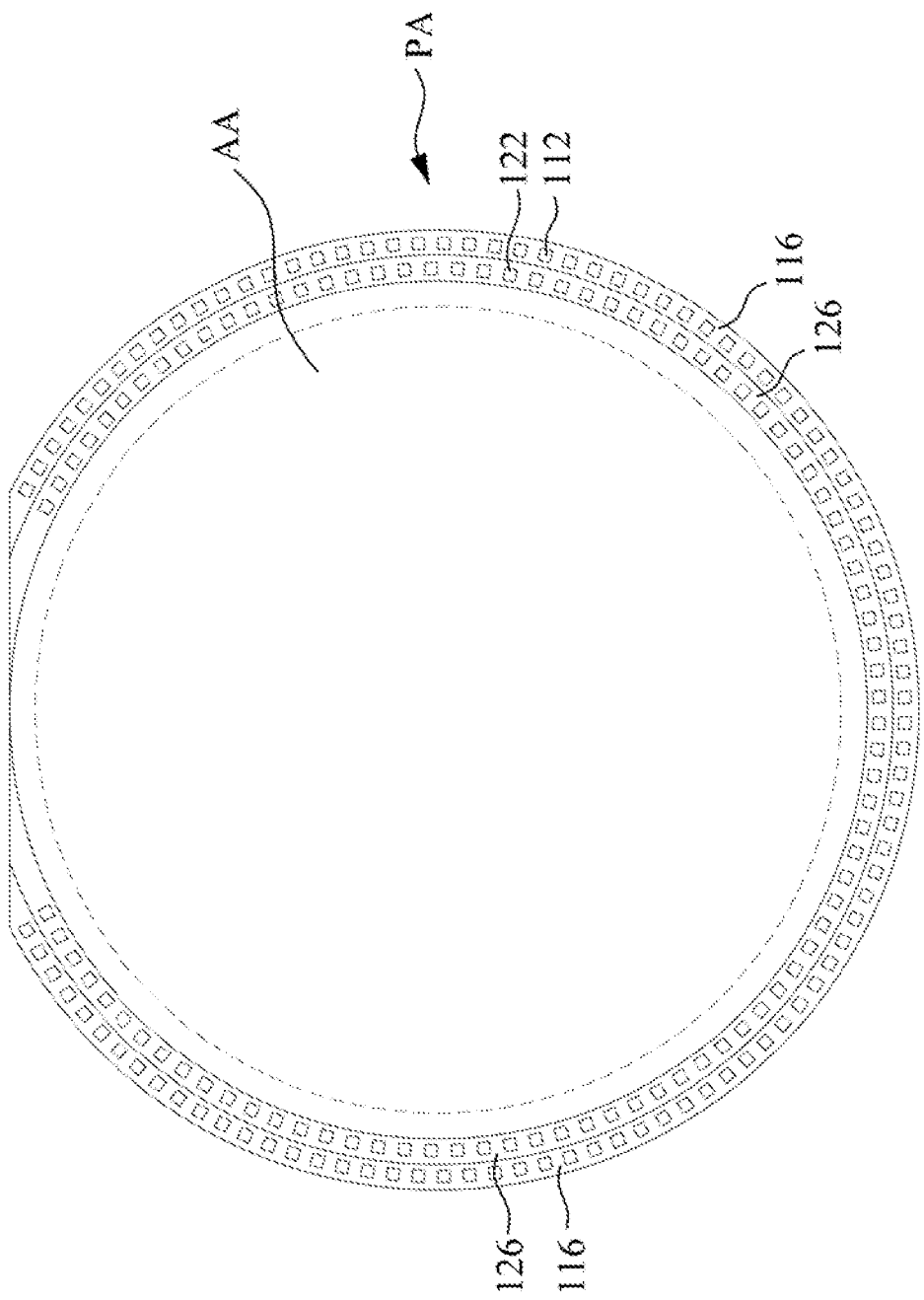
FIG. 4 is a schematic of the bonding region of the display device in FIG. 1.

FIG. 4 is a schematic of the bonding region of the display device 100 in FIG. 1. For clarity, the conductive wires 140 are omitted in FIG. 4. Reference is made to FIG. 1 and FIG. 4. The driving circuit substrate 110 includes a first bonding region 116, and the first conductive pads 112 are averagely distributed in the first bonding region 116. The TFT array substrate 120 includes a second bonding region 126, and the second conductive pads 122 are averagely distributed in the second bonding region 126. In other words, the configuration of the first conductive pads 112 and the second conductive pads 122 averagely distributed in the periphery region PA can be considered as disposing the first bonding region 116 and the second bonding region 126 in the periphery region PA of the display device 100 and surrounding the display region AA by the first bonding region 116 and the second bonding region 126. The profile of the TFT array substrate 120 in FIG. 4 is merely another embodiment of the present disclosure, and the present disclosure is not limited thereto.

As shown in FIG. 4, the orthogonal projection of the second bonding region 126 on the driving circuit substrate 110 is located between the first bonding region 116 and the display region AA. The second bonding region 126 surrounds the orthogonal projection of the front panel laminate 130 on the TFT array substrate 120. In other words, the orthogonal projection of the front panel laminate 130 on the TFT array substrate 120 is located in the range surrounded by the second bonding region 126. In the present embodiment, the first bonding region 116 and the second bonding region 126 have ring shapes. In other embodiments, the shapes of the first bonding region 116 and the second bonding region 126 can be determined by the overall profile of the display device 100.

Accordingly, by stacking the TFT array substrate 120 and the driving circuit substrate 110 of the display device 100 and surrounding the display region AA by the first bonding region 116 and the second bonding region 126, a bonding region protruded from the periphery region PA obviously can be avoid. With such design, the profile of the display device 100 is not affected by the outwardly protruded bonding region.

Figure 5:
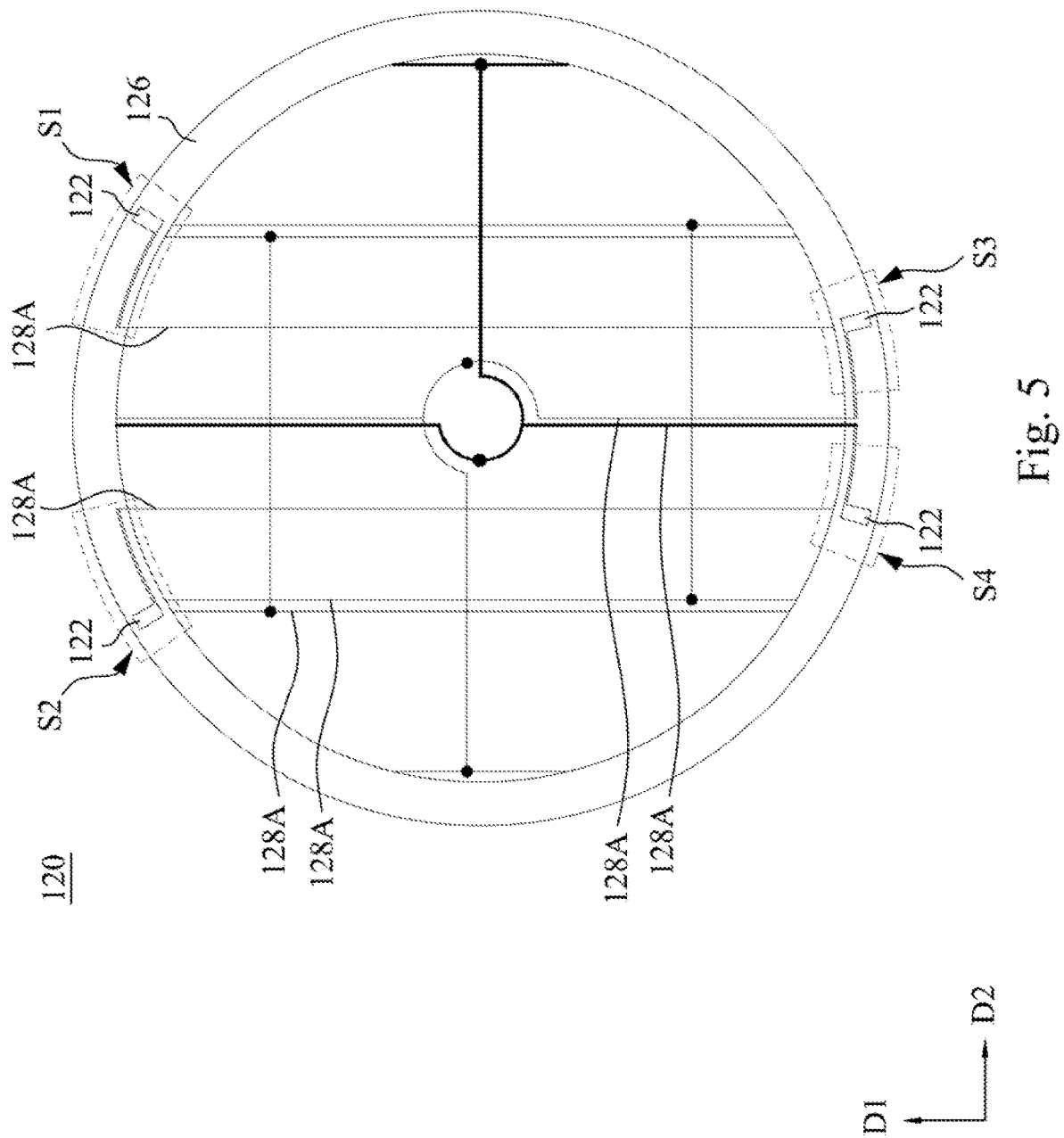
FIG. 5 is a schematic of a portion of the signal circuits of the TFT array substrate according to one embodiment of the present disclosure.

FIG. 5 is a schematic of a portion of the signal circuits of the TFT array substrate 120 according to one embodiment of the present disclosure. The TFT array substrate 120 includes multiple data lines 128A extending along a first direction D1. In the present embodiment, the TFT array substrate 120 has 240 data lines 128A, and multiple data lines 128A extend to a portion of the second conductive pads 122 corresponding to four regions S1-S4. Only a portion of the data lines 128A and the second conductive pads 122 in the regions S1-S4 are illustrated in FIG. 5. The regions S1-S4 are located at opposite two sides of the second bonding region 126 along the first direction D1. In other words, the positions of the regions S1-S4 in the second bonding region 126 are determined by the extending direction of the data line 128A. As such, the trace lengths of the data lines 128A electrically connected with the second conductive pads 122 can be reduced, and the signal circuits can be prevented from crowding at the same position which makes bonding region obviously protruding from the periphery region PA.

Figure 6:
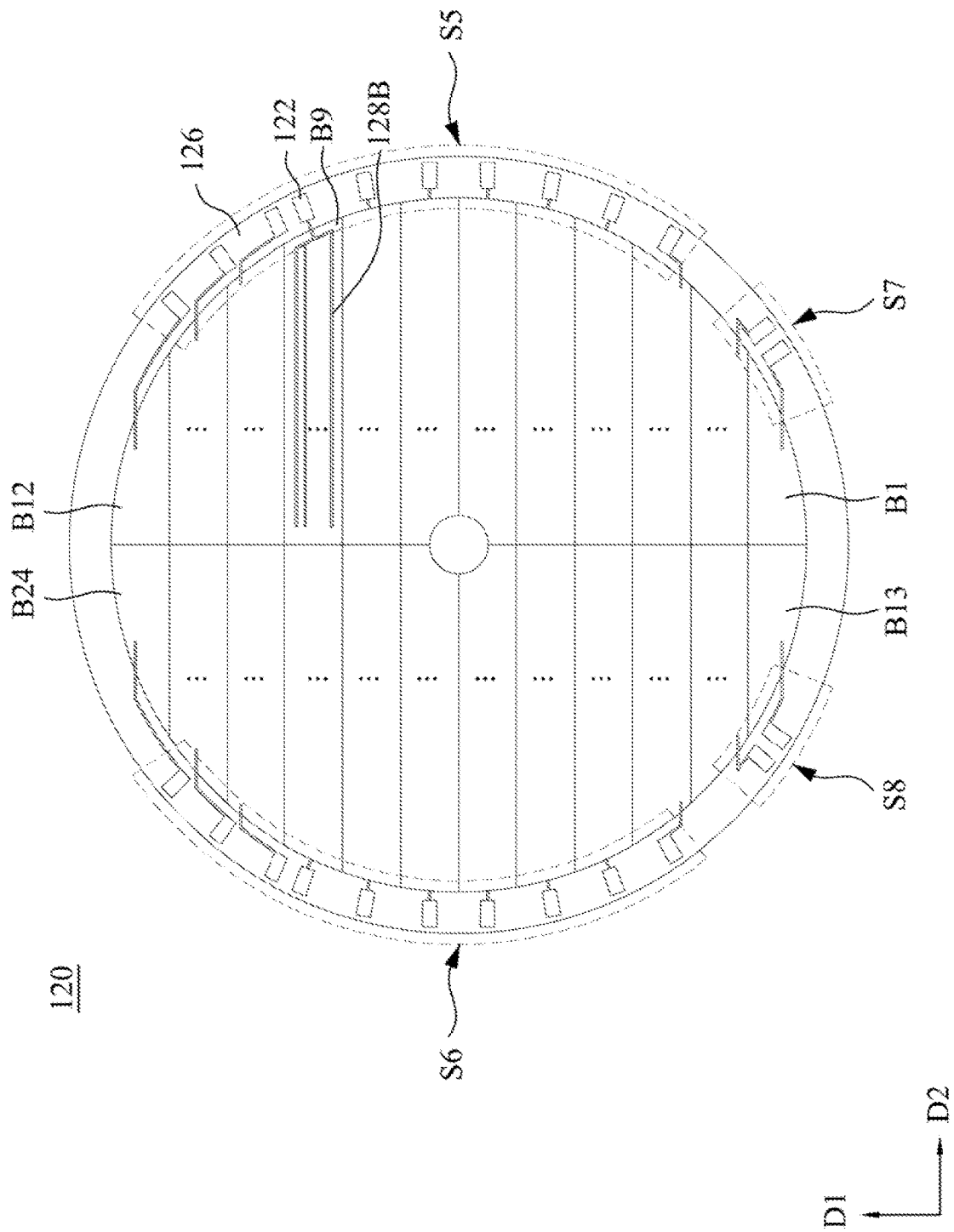
FIG. 6 is a schematic of another portion of the signal circuits of the TFT array substrate in FIG. 5.

FIG. 6 is a schematic of another portion of the signal circuits of the TFT array substrate 120 in FIG. 5. In the present embodiment, the TFT array substrate 120 is divided as 24 sections. Merely the regions B1, B9, B12, B13, B24 are labeled in FIG. 6. Each section includes 20 scan lines 128B extending along the second direction D2. Only a portion of the scan lines 128B in the section B9 are illustrated in FIG. 6, and the scan lines 128B in other sections are omitted. The scan lines 128B in each sections are electrically connected together and then collectively connected with a portion of the second conductive pads 122 in the four regions S5-S8. As shown in FIG. 6, the region S5 and the region S6 respectively include 10 second conductive pads 122, and the region S7 and the region S8 respectively include two second conductive pads 122. The regions S5-S8 are located at opposite two sides of the second bonding region 126 along the second direction D2. As such, the trace lengths of the scan lines 128B electrically connected with the second conductive pads 122 can be reduced, and the signal circuits can be prevented from crowding at the same position which produces obvious bonding region protruding from the periphery region PA.

Figure 7:
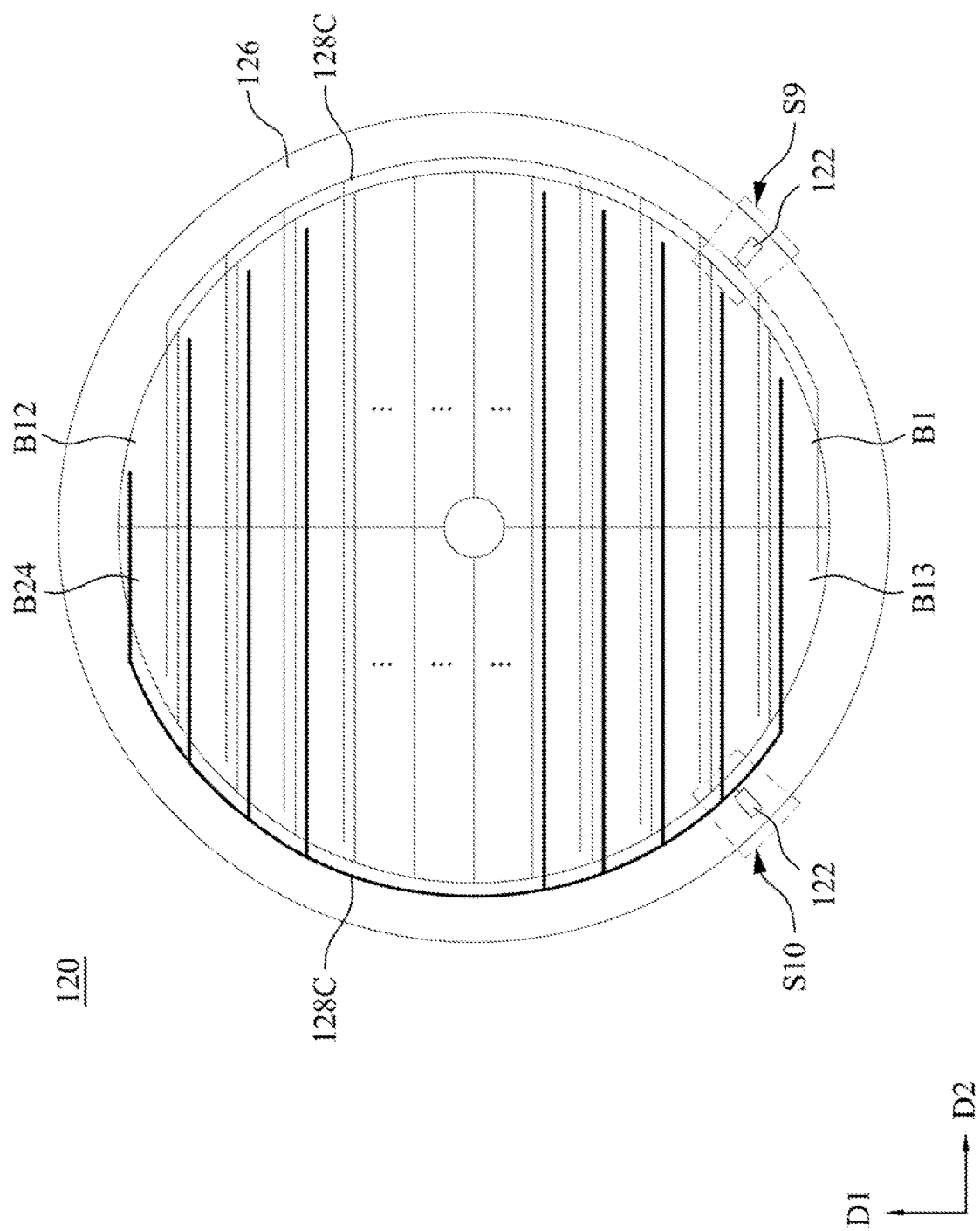
FIG. 7 is a schematic of another portion of the signal circuits of the TFT array substrate in FIG. 5.

FIG. 7 is a schematic of another portion of the signal circuits of the TFT array substrate 120 in FIG. 5. The TFT array substrate 120 includes multiple selection lines 128C extending along the second direction D2. In the present embodiment, each selection line 128C is electrically connected to the aforementioned 24 sections. Multiple selection lines 128C extend to a portion of the second conductive pads 122 in the two regions S9-S10. Merely two selection lines 128C and two second conductive pads 122 in the regions S9-S10 are illustrated in FIG. 7. The regions S9-S10 are located at opposite two sides of the second bonding region 126 along the second direction D2. As such, the trace lengths of the selection lines 128C electrically connected with the second conductive pads 122 can be reduced, and the signal circuits can be prevented from crowding at the same position which produces obvious bonding region protruding from the periphery region PA.

Reference is made to FIG. 5 to FIG. 7, the aforementioned multiple regions S1-S10 are separately located in the periphery region PA of the display device 100, and the regions S1-S10 are spaced apart from each other. As such, the signal circuits of the display device 100 can be separately connected to the second conductive pads 122 that are averagely distributed in the periphery region PA. In addition, the trace lengths can be reduced and the possibility of crossing of the traces can be reduced by electrically connecting the signal circuits to different second conductive pads 122 based on the extension direction of the signal circuits. In the embodiments above, positions of the regions S1-S10 can be changed as long as the trace lengths can be reduced and the crossing of the traces can be prevented.

Figure 8:
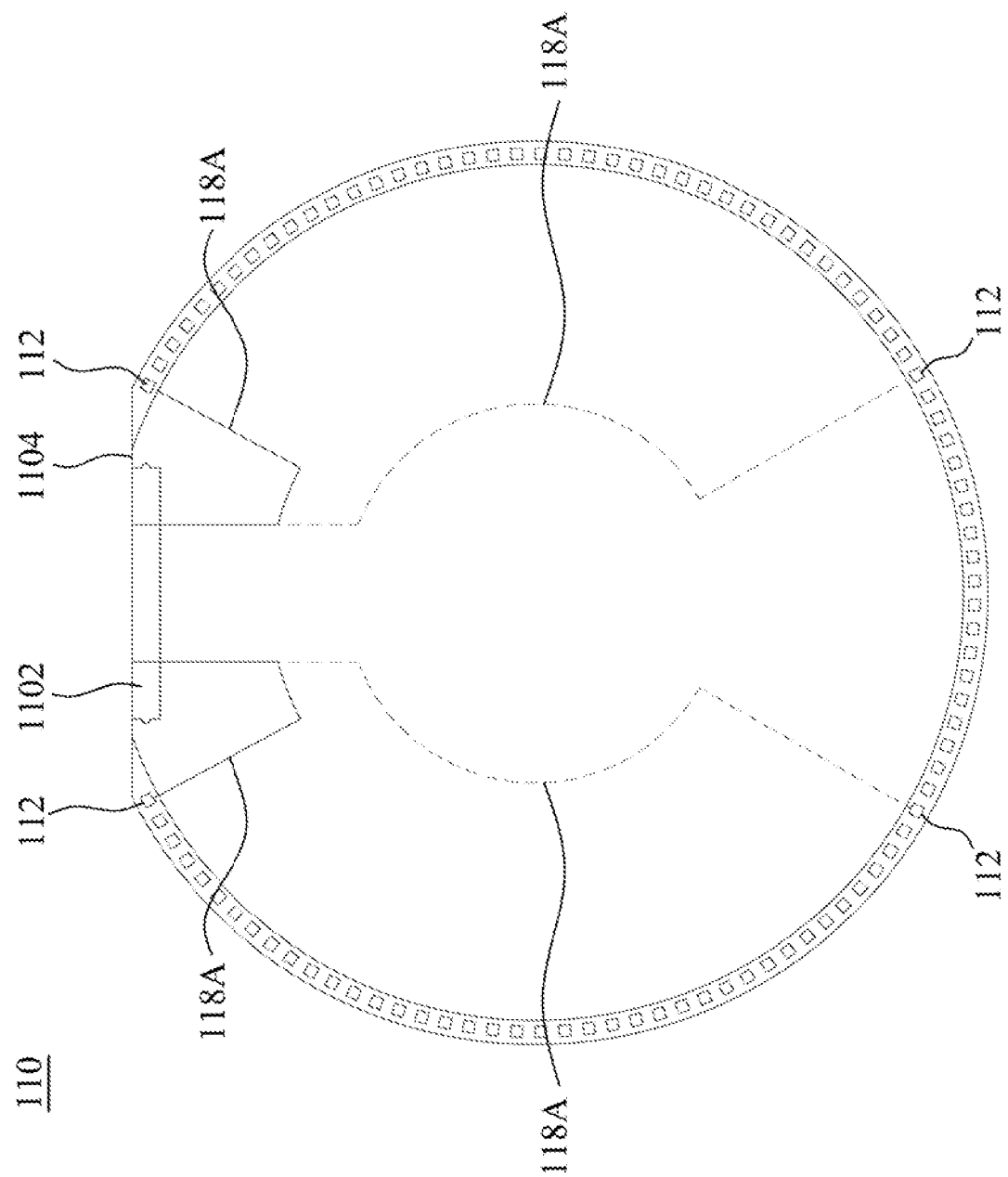
FIG. 8 is a schematic of a portion of the signal circuits of the driving circuit substrate according to one embodiment of the present disclosure.

FIG. 8 is a schematic of a portion of the signal circuits of the driving circuit substrate 110 according to one embodiment of the present disclosure. The driving circuit substrate 110 includes a driver connection region 1102, and the driver connection region 1102 is located at the side 1104 of the driving circuit substrate 110. In the present embodiment, the side 1104 is a trimmed edge. In other words, in the bottom view shown in FIG. 8, the side 1104 of the driving circuit substrate 110 is located in a boundary 1002 collectively formed by the driving circuit substrate 110 and the TFT array substrate 120. That is, the orthogonal projection of the side 1104 on the TFT array substrate 120 is located at the inner side of the orthogonal projection of the boundary 1002 on the TFT array substrate 120. Such design makes the shape of the TFT array substrate 120 more like circular shape. That is, the profile of the display device 100 is not affected by the outwardly protruded bonding region. The driving IC of the driving circuit substrate 110 can be disposed in the driver connection region 1102 or be disposed on the driving IC of a flexible substrate through chip on film process.

The signal circuits of the driving circuit substrate 110 include multiple first driving circuits 118A. Merely four first driving circuits 118A are illustrated in FIG. 8. Two opposite ends of the first driving circuits 118A are electrically connected with the driver connection region 1102 and a portion of the first conductive pads 112, respectively. In the present embodiment, the first driving circuits 118A of the driving circuit substrate 110 correspond to the data lines 128A of the TFT array substrate 120 shown in FIG. 5, respectively. In other words, the four first driving circuits 118A in FIG. 8 are electrically connected with the second conductive pads 122 and the data lines 128A in the regions S1-S4 through the first conductive pads 112.

Reference is made to FIG. 8 and FIG. 1, a driving circuit structure in another embodiment of the present disclosure is formed by the driving circuit substrate 110 and the TFT array substrate 120. The driving circuit substrate 110 includes the driver connection region 1102, and the driver connection region 1102 is located at the side 1104 of the driving circuit substrate 110. The TFT array substrate 120 is located on the driving circuit substrate 110. When the driving circuit is viewed in the top view, the side 1104 of the driving circuit substrate 110 is located inside a boundary 1002 collectively formed by the driving circuit substrate 110 and the TFT array substrate 120.

Figure 9:
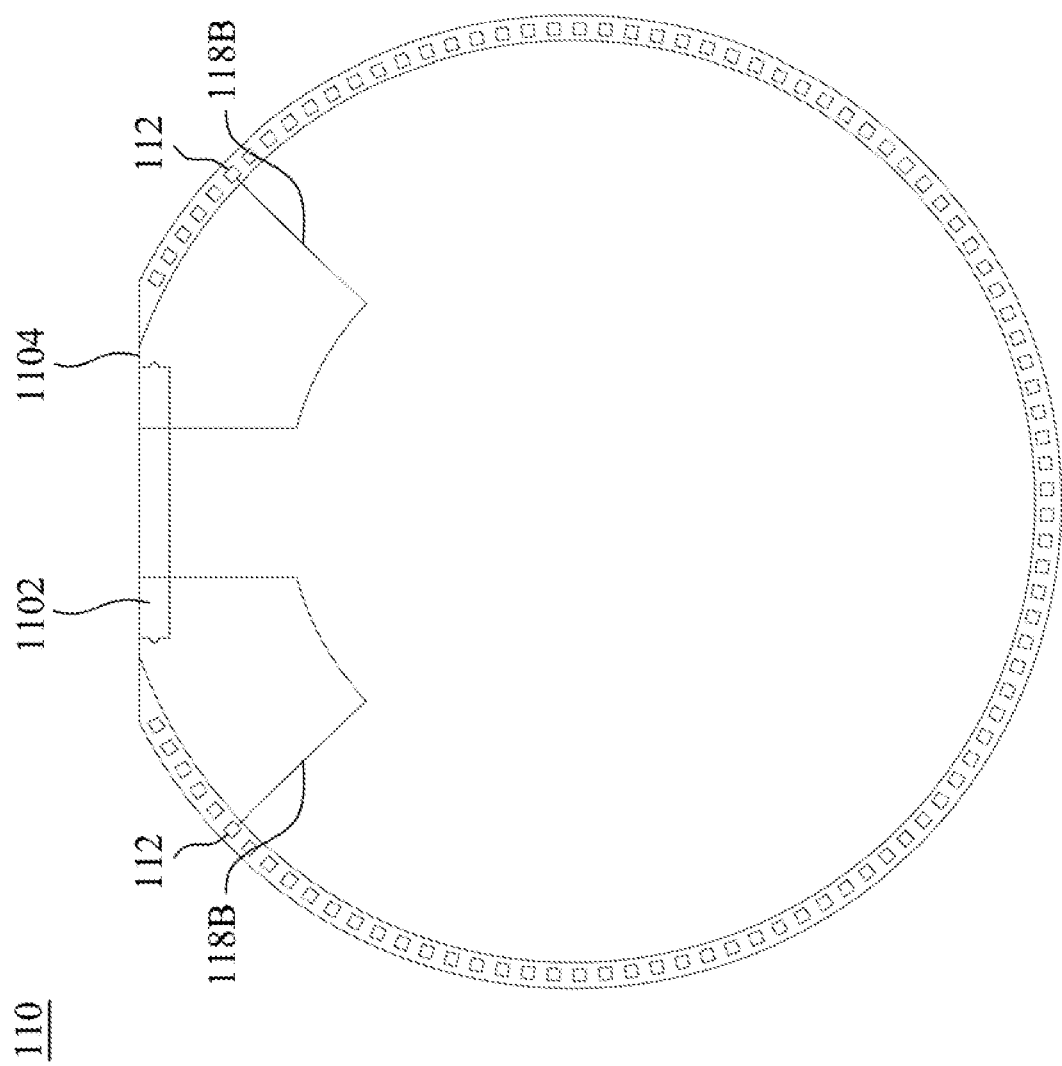
FIG. 9 is a schematic of another portion of the signal circuits of the driving circuit substrate in FIG. 8.

FIG. 9 is a schematic of another portion of the signal circuits of the driving circuit substrate in FIG. 8. The signal circuits of the driving circuit substrate 110 include multiple second driving circuits 118B. Merely two second driving circuits 118B are illustrated in FIG. 9. Two opposite ends of the second driving circuits 118B are electrically connected with the driver connection region 1102 and a portion of the first conductive pads 112, respectively. In the present embodiment, the second driving circuits 118B of the driving circuit substrate 110 correspond to the scan lines 128B of the TFT array substrate 120 shown in FIG. 6, respectively. The two second driving circuits 118B in FIG. 9 are electrically connected with the second conductive pads 122 and the scan lines 128B in the regions S5-S6 through the first conductive pads 112.

Figure 10:
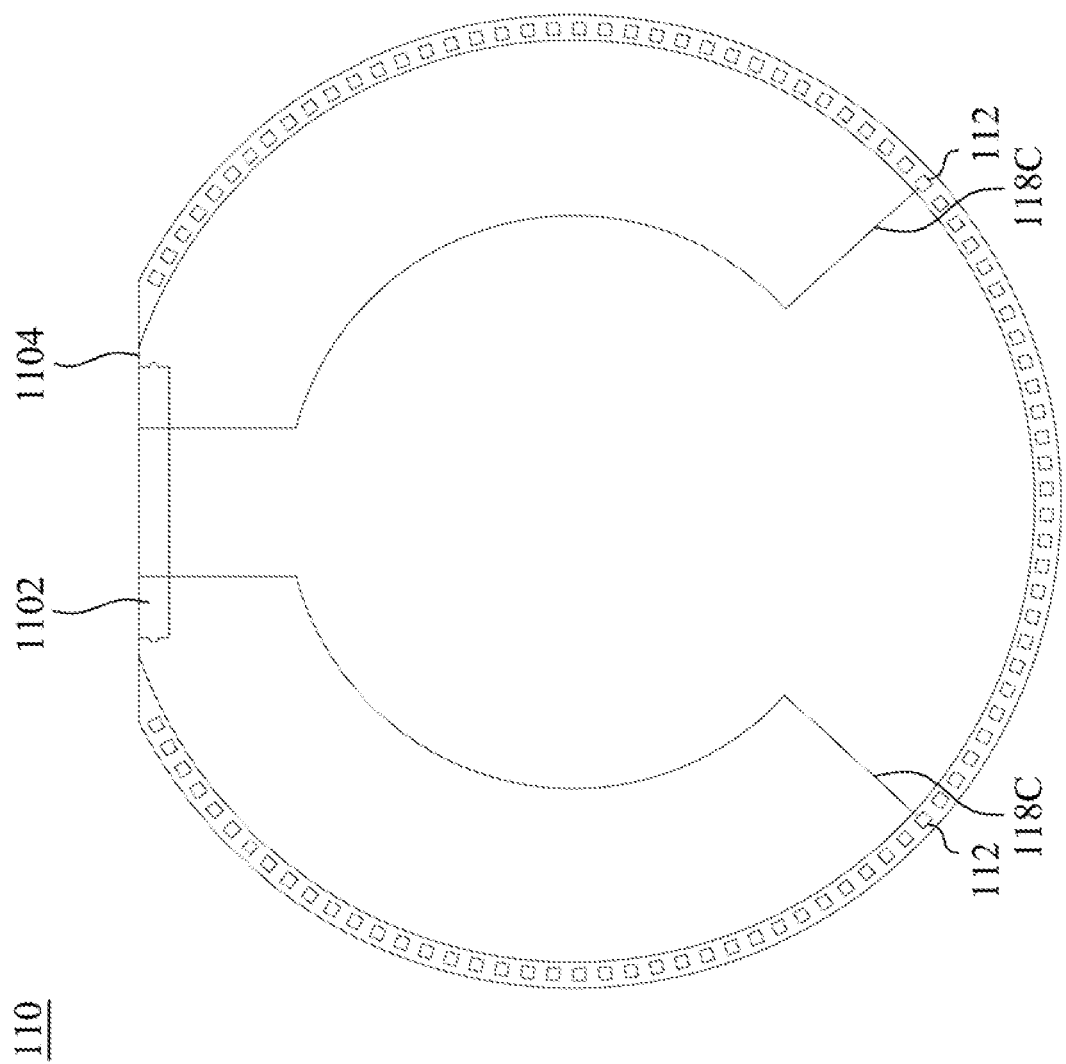
FIG. 10 is a schematic of another portion of the signal circuits of the driving circuit substrate in FIG. 8.

FIG. 10 is a schematic of another portion of the signal circuits of the driving circuit substrate in FIG. 8. The signal circuits of the driving circuit substrate 110 include multiple third driving circuits 118C. Merely two third driving circuits 118C are illustrated in FIG. 10. Two opposite ends of the third driving circuits 118C are electrically connected with the driver connection region 1102 and a portion of the first conductive pads 112, respectively. In the present embodiment, the third driving circuits 118C of the driving circuit substrate 110 correspond to the selection lines 128C of the TFT array substrate 120 shown in FIG. 7, respectively. The two third driving circuits 118C in FIG. 10 are electrically connected with the second conductive pads 122 and the selection lines 128C in the regions S9-S10 through the first conductive pads 112.

Figure 11:
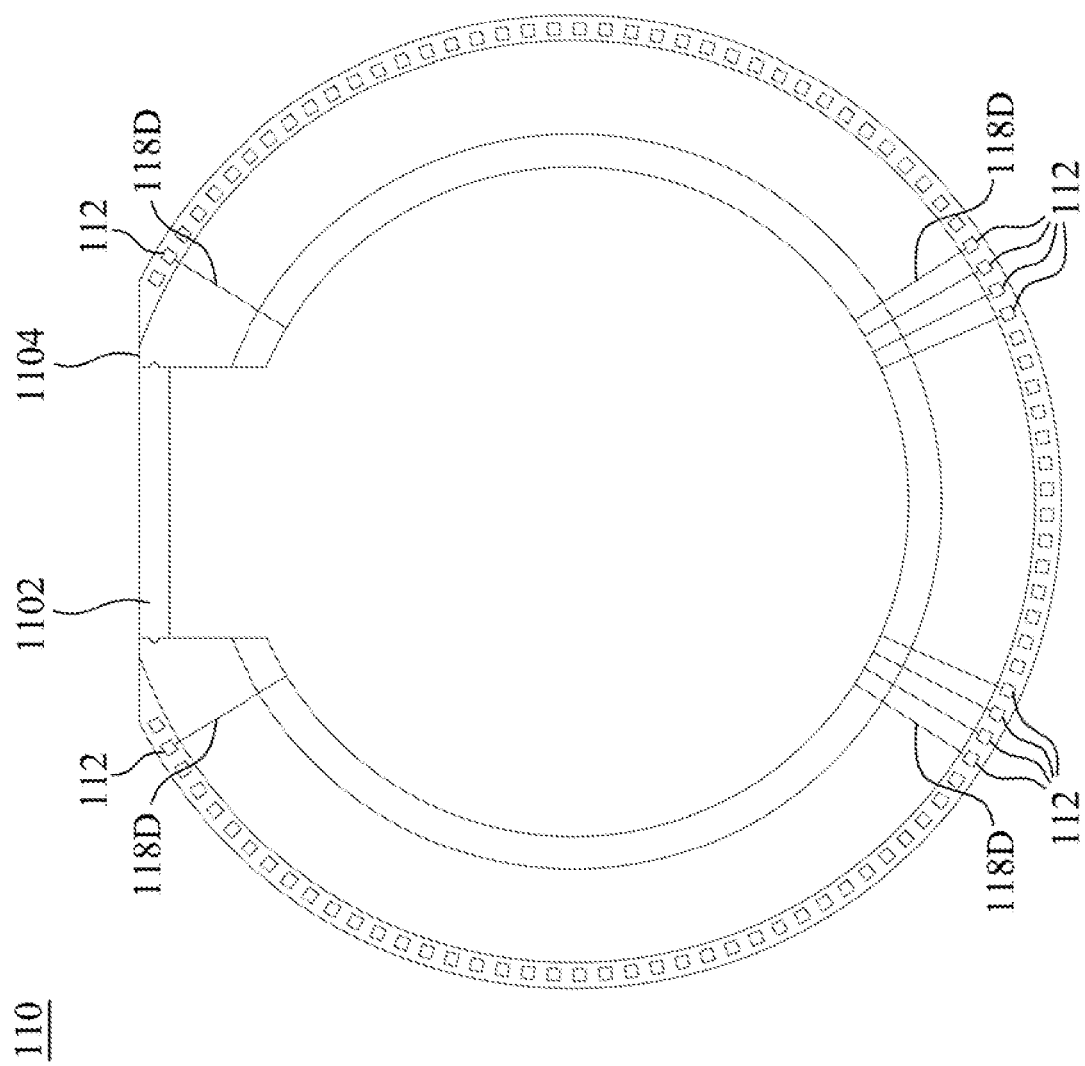
FIG. 11 is a schematic of another portion of the signal circuits of the driving circuit substrate in FIG. 8.

FIG. 11 is a schematic of another portion of the signal circuits of the driving circuit substrate in FIG. 8. The signal circuits of the driving circuit substrate 110 include multiple common voltage circuits 118D. Two opposite ends of the common voltage circuits 118D are electrically connected with the driver connection region 1102 and a portion of the first conductive pads 112, respectively. In the present embodiment, each one of the common voltage circuits 118D is electrically connected with at least one of the first conductive pads 112. The first conductive pads 112 can be electrically connected with more than one of the common voltage circuits 118D. In other words, the first conductive pads 112 and the common voltage circuits 118D are not limited to one-to-one connection. For example, as shown in FIG. 11, the ring-shaped circuits with different voltages can extend and be connected to the same one of the first conductive pads 112.

Reference is made to FIG. 8 to FIG. 11. The first driving circuits 118A, the second driving circuits 118B, the third driving circuits 118C can be distributed separated in the periphery region PA of the display device 100 by being disposed in the regions S1-S10 shown in FIG. 5 to FIG. 7 and by making the regions S1-S10 away from each other. As such, the signal circuits of the display device 100 are separately connected to the first conductive pads 112 and the second conductive pads 122 separately distributed in the periphery region PA.

Figure 12B:
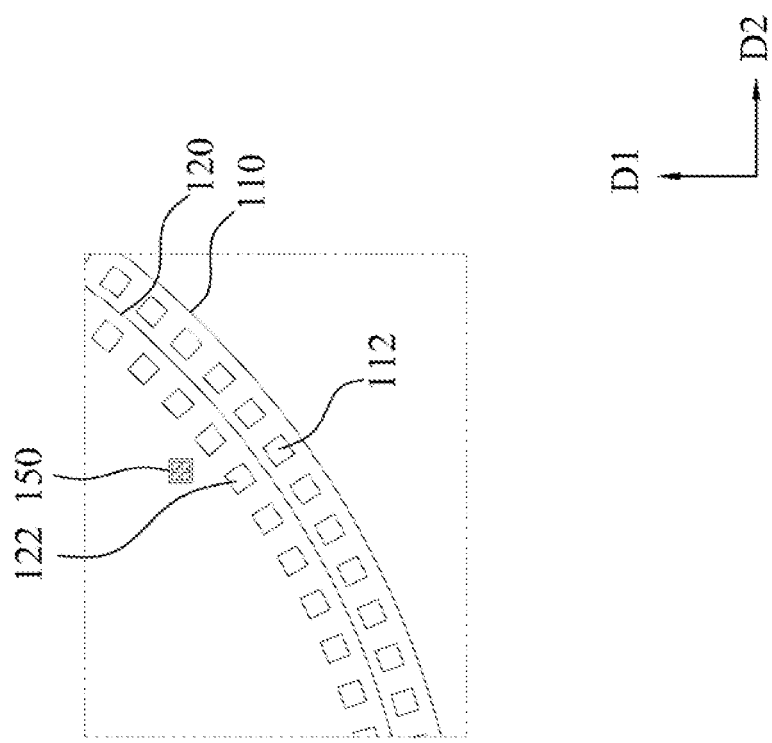
FIG. 12B is a schematic of positioning marks according to another embodiment of the present disclosure.
Figure 12A:
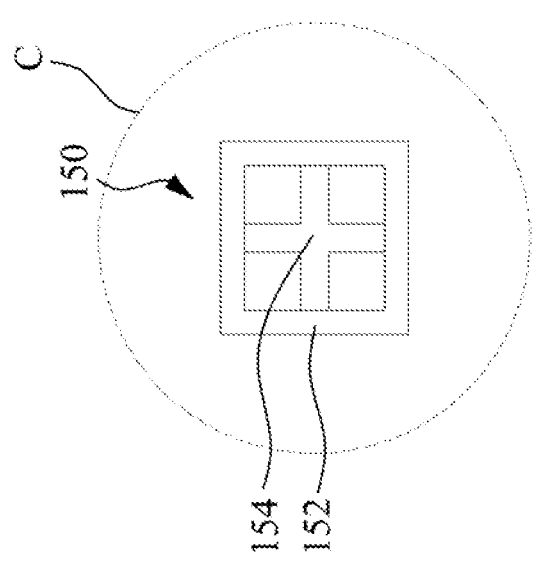
FIG. 12A is a schematic of positioning marks according to one embodiment of the present disclosure.

FIG. 12A is a schematic of positioning marks 150 according to one embodiment of the present disclosure. Reference is made to FIG. 1 and FIG. 12A. The display device 100 includes a center region C, and the positioning marks 150 are disposed in the center region C. The positioning marks 150 are composed by a first pattern 152 and a second pattern 154, and the second pattern 154 is configured to match the first pattern 152. The first pattern 152 and the second pattern 154 can be formed at the positions of the driving circuit substrate 110 and the TFT array substrate 120 corresponding to the center region C, respectively. Positioning of the stacked driving circuit substrate 110 and the TFT array substrate 120 are performed by using the positioning marks 150. The first pattern 152 mentioned above is a rectangular frame, and the second pattern 154 has a cross shape, but the present disclosure is not limited thereto.

FIG. 12B is a schematic of positioning marks 150 according to another embodiment of the present disclosure. In the present embodiment, the positioning marks 150 are disposed close to the first conductive pads 112 and the second conductive pads 122 in position such as the framed region A shown in FIG. 1. In other embodiment, the display device 100 includes multiple positioning marks 150 so as to perform alignment along the first direction D1 and the second direction D2. In other embodiments, a positioning mark can be composed by two sets of rulers, and the rulers are arranged along the first direction D1 and the second D2 so as to perform alignment along the first direction D1 and the second direction D2.

Figure 13C:
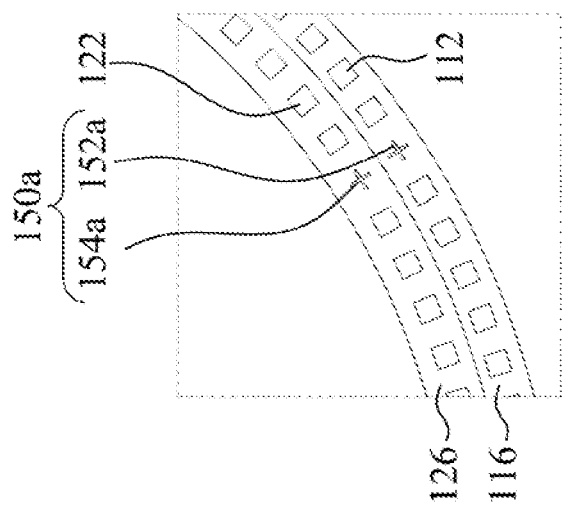
FIG. 13A to FIG. 13C are schematics of positioning marks according to another embodiment of the present disclosure.
Figure 13B:
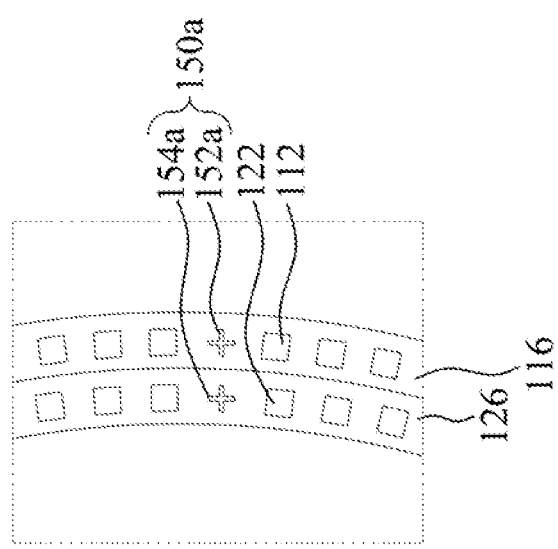
Figure 13A:
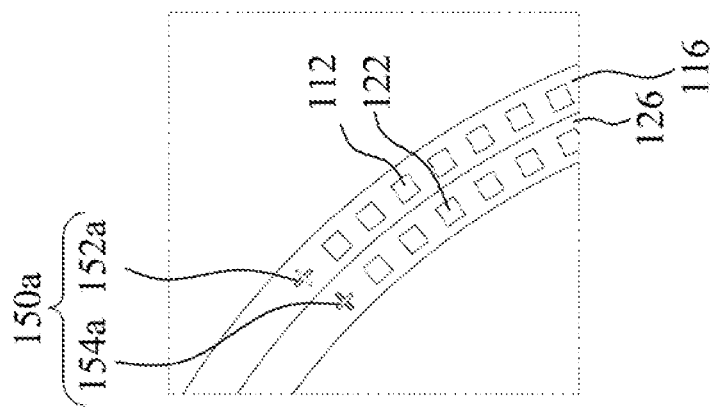

FIG. 13A to FIG. 13C are schematics of positioning marks 150a according to another embodiment of the present disclosure. The positioning marks 150a are composed by a first pattern 152a and a second pattern 154a. The positioning marks 150a and the second pattern 154a are formed on the driving circuit substrate 110 and the TFT array substrate 120. In the present embodiment, the first pattern 152a and the first conductive pads 112 are arranged as a ring collectively, and the second pattern 154a and the second conductive pads 122 are arranged as a ring collectively. In other words, the first pattern 152a can be disposed in the first bonding region 116, and the second pattern 154a can be disposed in the second bonding region 126.

The positioning marks 150a in FIG. 13A to FIG. 13C respectively correspond to the top right, the right, and the bottom right of the display device 100 (see FIG. 1) in positions. Similarly, the positioning marks 150a can also be disposed at the top left, the left, and the bottom left of the display device 100. In other words, the display device 100 can include multiple first patterns 152a averagely distributed in the first bonding region 116 and include multiple second patterns 154a averagely distributed in the second bonding region 126 so as to perform alignment along the first direction D1 and the second direction D2.

In summary, by stacking the TFT array substrate and the driving circuit substrate of the display device and distributing the first conductive pads and the second conductive pads averagely in the periphery region (which means the first bonding region and the second bonding region surround the display region), a bonding region protruded from the periphery region obviously can be avoid. Such design prevents the profile of the display device from affecting by the outwardly protruded bonding region. In addition, the trace lengths can be reduced and the possibility of crossing of the traces can be reduced by electrically connecting the signal circuits to different second conductive pads based on the extension direction of the signal circuits.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A display device having a display region and a periphery region surrounding the display region, wherein the display device comprises:
   a driving circuit substrate comprising a plurality of first conductive pads;
   a TFT array substrate comprising a plurality of second conductive pads and a plurality of data lines extending along a first direction, wherein the TFT array substrate is located on the driving circuit substrate, the data lines are electrically connected with a portion of the second conductive pads, and the portion of the second conductive pads are located at opposite two sides of the display device along the first direction;
   a front plane laminate comprising a display medium layer, wherein the TFT array substrate is located between the driving circuit substrate and the front plane laminate; and
   a plurality of conductive wires electrically connected with the first conductive pads and the second conductive pads respectively, wherein the first conductive pads and the second conductive pads are located in the periphery region.

2. The display device of claim 1, wherein an orthogonal projection of the TFT array substrate on the driving circuit substrate is free from overlapping with the first conductive pads.

3. The display device of claim 1, wherein an area of the driving circuit substrate is greater than an area of the TFT array substrate.

4. The display device of claim 1, wherein the first conductive pads averagely surround the TFT array substrate.

5. The display device of claim 1, wherein the first conductive pads are located on a surface of the driving circuit substrate facing the TFT array substrate.

6. The display device of claim 1, wherein the second conductive pads averagely surround the front plane laminate.

7. The display device of claim 1, wherein the driving circuit substrate, the TFT array substrate, and the front plane laminate have a circular shape.

8. The display device of claim 1, wherein the TFT array substrate further comprises a plurality of scan lines extending along a second direction, the scan lines are electrically connected with a portion of the second conductive pads, and the portion of the second conductive pads are located at opposite two sides of the display device along the second direction.

9. The display device of claim 1, wherein the TFT array substrate further comprises a plurality of selection lines extending along a second direction, the selection lines are electrically connected with a portion of the second conductive pads, and the portion of the second conductive pads are located at opposite two sides of the display device along the second direction.

10. The display device of claim 1, wherein the driving circuit substrate further comprises a first pattern, and the TFT array substrate further comprises a second pattern matching the first pattern.

11. A display device having a display region and a periphery region surrounding the display region, wherein the display device comprises:
   an driving circuit substrate comprising a plurality of first conductive pads, a plurality of first driving circuits, and a driver connection region, wherein the driver connection region is located at a side of the driving circuit substrate, and opposite two sides of each one of the first driving circuits are electrically connected with one of the first conductive pads and connected with the driver connection region;
   a TFT array substrate comprising a plurality of second conductive pads, wherein the TFT array substrate is located on the driving circuit substrate;
   a front plane laminate comprising a display medium layer, wherein the TFT array substrate is located between the driving circuit substrate and the front plane laminate; and
   a plurality of conductive wires electrically connected with the first conductive pads and the second conductive pads respectively, and wherein when viewed in a top view, an orthogonal projection of the driver connection region is in a boundary formed by the driving circuit substrate and the TFT array substrate collectively.

12. The display device of claim 11, wherein the driving circuit substrate further comprises a plurality of common voltage circuits, and opposite two sides of each one of the common voltage circuit are electrically connected with one of the first conductive pads and connected with the driver connection region.

13. The display device of claim 12, wherein one of the first conductive pads is electrically connected with more than one of the common voltage circuits.

14. The display device of claim 11, wherein the boundary collectively formed by the driving circuit substrate, the TFT array substrate, and the front plane laminate has a circular shape.

15. A driving circuit structure, applied in a display device, wherein the driving circuit structure comprises:
- an driving circuit substrate comprising a driver connection region, wherein the driver connection region is located at a side of the driving circuit substrate; and
- a TFT array substrate located on the driving circuit substrate and a plurality of second conductive pads, wherein the TFT array substrate further comprises a plurality of data lines extending along a first direction and a plurality of scan lines extending along a second direction, the data lines are electrically connected with a portion of the second conductive pads, the scan lines are electrically connected with a portion of the second conductive pads, and the portion of the second conductive pads are located at opposite two sides of the display device along the second direction, and wherein when viewed in a top view, an orthogonal projection of the driver connection region is in a boundary form by the driving circuit substrate and the TFT array substrate collectively.

* * * * *